United States Patent
Sheu et al.

(10) Patent No.: US 8,073,825 B2
(45) Date of Patent: Dec. 6, 2011

(54) DATA CORRECTION APPARATUS, DATA CORRECTION METHOD AND TANGIBLE MACHINE-READABLE MEDIUM THEREOF

(75) Inventors: Shiann-Tsong Sheu, Taipei (TW); Tsung-Yu Tsai, Shanhua Town (TW); Kai-Fang Cheng, Taipei (TW); Chih Sheng Chang, Taipei (TW); Hui-Yu Lee, Hualien (TW)

(73) Assignee: Institute for Information Industry, Taipei (TW)

( * ) Notice: Subject to any disclaimer, the term of this patent is extended or adjusted under 35 U.S.C. 154(b) by 349 days.

(21) Appl. No.: 12/486,305

(22) Filed: Jun. 17, 2009

(65) Prior Publication Data

US 2010/0153817 A1    Jun. 17, 2010

(30) Foreign Application Priority Data

Dec. 15, 2008 (TW) ................................ 97148793 A

(51) Int. Cl.
*G06F 7/00* (2006.01)
(52) U.S. Cl. ................... 707/699; 707/999.006; 714/758
(58) Field of Classification Search .................. 714/758; 707/699, 999.006
See application file for complete search history.

(56) References Cited

U.S. PATENT DOCUMENTS

| | | | | |
|---|---|---|---|---|
| 5,481,566 A | * | 1/1996 | Kulesa | 375/259 |
| 6,003,151 A | * | 12/1999 | Chuang | 714/752 |
| 7,426,679 B2 | * | 9/2008 | Gorshe | 714/785 |
| 2002/0046382 A1 | * | 4/2002 | Yang | 714/758 |
| 2004/0153945 A1 | * | 8/2004 | Takami | 714/758 |
| 2008/0022185 A1 | * | 1/2008 | Kiryu | 714/759 |
| 2008/0288845 A1 | * | 11/2008 | Tsfati et al. | 714/748 |
| 2009/0006922 A1 | * | 1/2009 | Yoshida | 714/755 |

\* cited by examiner

*Primary Examiner* — Kuen Lu
*Assistant Examiner* — Jessica N Le
(74) *Attorney, Agent, or Firm* — Patterson Thuente Christensen Pedersen, P.A.

(57) ABSTRACT

A data correction apparatus, a data correction method and a tangible machine-readable medium thereof are provided. The data correction method comprises the following steps: receiving a plurality of packets; determining that all of the packets are erroneous packets according to cyclic redundancy check (CRC) information thereof; retrieving any number of pairs among the packets to proceed an exclusive-OR (XOR) logical calculation to generate a plurality of error patterns; obtaining an overall error pattern according to an OR logical calculation of the error patterns; and calculating a correct packet according to one or more of the packets and the overall error pattern.

24 Claims, 4 Drawing Sheets

US 8,073,825 B2

DATA CORRECTION APPARATUS, DATA CORRECTION METHOD AND TANGIBLE MACHINE-READABLE MEDIUM THEREOF

This application claims the benefit of priority based on Taiwan Patent Application No. 097148793, filed on Dec. 15, 2008, the contents of which are incorporated herein by reference in their entirety.

CROSS-REFERENCES TO RELATED APPLICATIONS

Not applicable.

BACKGROUND OF THE INVENTION

1. Field of the Invention

The present invention relates to a data correction apparatus, a data correction method and a tangible machine-readable medium thereof. More particularly, the present invention relates to a data correction apparatus, a data correction method and a tangible machine-readable medium thereof that use cyclic redundancy check (CRC) information to calculate a correct packet.

2. Descriptions of the Related Art

With the aid of network communications, users are able to exchange information, conduct voice communication or even conduct goods transactions. For this reason, networks have become indispensable in the daily life of modern people. Users can upload or download a wide variety of information via networks, and such information is transmitted via the networks in form of data packets. However, due to the noise in the network data transmission channel or communication interference from other data transmissions underway in the networks, errors or even corruptions usually occur in the data packets when being received at the receiving end, thereby causing degradation in the performance of the network communications.

To improve this problem, network equipment manufacturers have used the cyclic redundancy check (CRC) mechanism that has been practiced for many years. CRC is a kind of error detection mechanism which has found wide application in media access control (MAC) layers of wired and wireless networks. To use the CRC mechanism, a data transmitting end adds, in the data to be transmitted, a CRC remainder to generate a data packet with a CRC code, and then transmits the resulting data packet with the CRC code. When receiving the data packet with the CRC code, the receiving end checks the packet against the CRC code, and if an error is found in the received data packet, the receiving end will abandon the data packet that is determined to be erroneous.

In combination with the aforesaid CRC mechanism for error detection, the receiving end may further employ a retransmission mechanism, e.g., the automatic repeat request (ARQ) or hybrid automatic repeat request (HARQ) framework, to request the transmitting end to retransmit the previously transmitted data packet with the CRC code. In this way, the receiving end can filter out erroneous data packets and acquire the correct data packet through retransmissions, thereby decreasing the error rate of data transmissions in network communications.

Unfortunately, in case the network data transmission channel experiences very poor conditions or suffers from very serious communication interference, the data transmitting end has to retransmit the data packet many times to ensure that the correct data packet has been received without error at the receiving end. This is effective in decreasing the error rate of data transmissions, but wastes network bandwidth resources. Accordingly, decreasing both the error rate of data transmissions and usage of network bandwidth resources at the same time in the network communications is still a problem.

SUMMARY OF THE INVENTION

One objective of the present invention is to provide a data correction apparatus, which comprises a reception module, a determination module, a pattern generating module and a calculation module. The reception module is configured to receive a first packet, a second packet and a third packet. The first packet comprises a plurality of first data bits and CRC information, the second packet comprises a plurality of second data bits and the CRC information, and the third packet comprises a plurality of third data bits and the CRC information. The determination module is configured to determine whether the first packet, the second packet and the third packet are erroneous packets according to the CRC information. When the first packet, the second packet and the third packet are all erroneous packets, the pattern generating module retrieves any number of pairs among each of the first data bits, each of the second data bits and each of the third data bits to perform an XOR logical operation thereon to generate a plurality of error patterns. Then, the pattern generating module further performs an OR logical operation on the plurality of error patterns to generate an overall error pattern. Finally, the calculation module is configured to calculate a correct packet according to the overall error pattern and either the first packet, the second packet or the third packet.

Another objective of the present invention is to provide a data correction method, which comprises the following steps: receiving a first packet, wherein the first packet comprises a plurality of first data bits and CRC information; determining that the first packet is an erroneous packet according to the CRC information; receiving a second packet, wherein the second packet comprises a plurality of second data bits and the CRC information; determining that the second packet is an erroneous packet according to the CRC information; receiving a third packet, wherein the third packet comprises a plurality of third data bits and the CRC information; determining that the third packet is an erroneous packet according to the CRC information; retrieving any number of pairs among each of the first data bits, each of the second data bits and each of the third data bits to perform an XOR logical operation thereon to generate the same number of error patterns as the erroneous packets; performing an OR logical operation on the error patterns to generate an overall error pattern; and calculating a correct packet according to the overall error pattern and either the first packet, second packet or the third packet.

This invention also provides a tangible machine-readable medium storing a computer program product for the data correction apparatus to perform the data correction method.

According to the above description, the data correction apparatus, the data correction method and the tangible machine-readable medium thereof of the present invention further retrieves information of each bit in the packets that are determined to be erroneous to correct and calculate a correct packet. In this way, the present invention remarkably reduces the retransmissions of packets and consequently the usage of network bandwidth resources, thereby rendering the use of the network bandwidth resources more efficient.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, the present invention will be explained with reference to embodiments thereof. However, these embodiments are described only for purposes of illustration but not limitation. It should be appreciated that in the following embodiments and attached drawings, elements unrelated to the present invention are omitted from depiction; and the dimensional relationships among the individual elements depicted in the attached drawings are only for ease of understanding but not to limit the actual scales.

Figure 1:
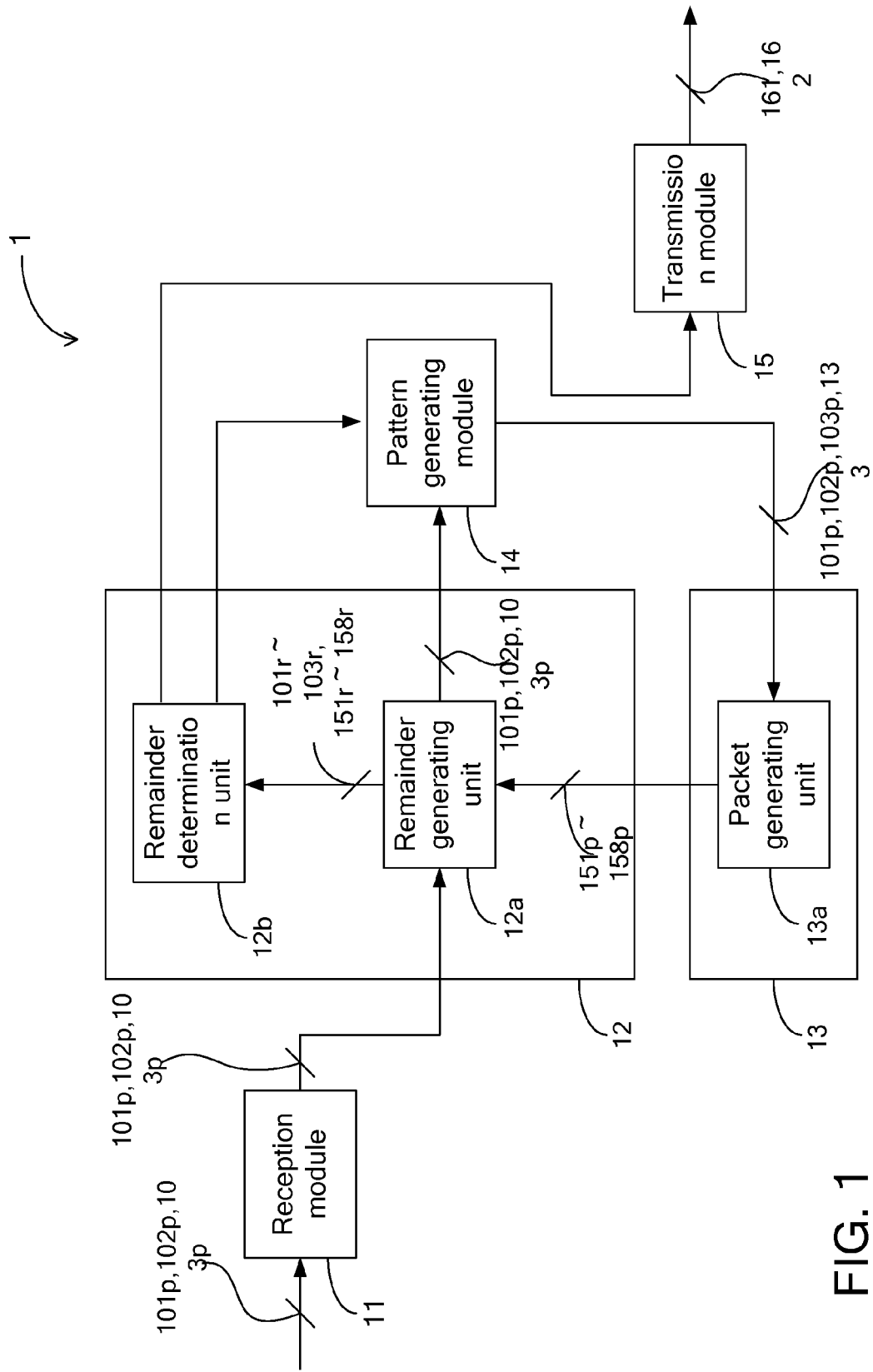
FIG. 1 is a schematic view of a first embodiment of the present invention.

FIG. 1 depicts a first embodiment of the present invention, which is a data correction apparatus 1. The data correction apparatus 1 may be deployed at a receiving end of a wired or wireless communication system (not shown) with ARQ/HARQ or spatial multiplexing scheme. The data correction apparatus 1 comprises a reception module 11, a determination module 12, a calculation module 13, a pattern generating module 14 and a transmission module 15. The calculation module 13 comprises a packet generating unit 13a. The determination module 12 further comprises a remainder calculation unit 12a and a remainder determination unit 12b.

When a transmitting end of the wired/wireless communication system transmits the data packet to the data correction apparatus 1 at the receiving end, the transmitting end first generates a correct packet with a CRC code according to the conventional CRC mechanism. For example, if a bit string of the data packet to be transmitted is [1000], then through the CRC mechanism, the transmitting end can perform a calculation according to a generation polynomial (a bit string of which is [101]) to learn that a bit string of the correct packet with both the data packet and the CRC information is [100, 011]. The correct packet [100,011] comprises a plurality of data bits and the CRC information. Then, the transmitting end transmits the correct packet [100,011] to the data correction apparatus 1 at the receiving end.

The remainder generating unit 12a of the determination module 12 comprises one or more CRC circuits (not shown), and the remainder determination unit 12b comprises one or more determination circuits (not shown). It should be appreciated that, in terms of structures and operations, both the remainder generating unit 12a and the remainder determination unit 12b of the determination module 12 are just the same as the conventional standard hardware circuits that implement the CRC mechanism. The present invention has no limitation on the number of CRC circuits included in the generating unit 12a; similarly, the present invention has no limitation on the number of determination circuits included in the determination unit 12b. Rather, those of ordinary skill in the art may arrange an appropriate number of such circuits depending on the practical needs, and thus, this will not be further described herein.

Very poor channel conditions and interference from other communication signals may cause an erroneous packet to be received at the receiving end. In particular, when receiving a first packet 101p (a bit string of which is [100,111]), the reception module 11 transmits the first packet 101p ([100, 111]) to the remainder generating unit 12a of the determination module 12. The remainder generating unit 12a then calculates a first CRC remainder 101r according to the aforesaid generation polynomial [101] and the first packet 101p [100, 111]. More specifically, by using the first packet 101p [100, 111] as a dividend and the generation polynomial [101] as a divisor, the remainder generating unit 12a performs a binary division operation to obtain a result of the first CRC remainder 101r (a bit string of which is [100]).

Thereafter, the remainder generating unit 12a transmits the first CRC remainder 101r [100] to the remainder determination unit 12b, which then determines whether the first CRC remainder 101r [100] is equal to zero. Because the first CRC remainder 101r [100] calculated previously is not equal to zero, the determination module 12 determines that the first packet 101p [100,111] is an erroneous packet, and the transmission module 15 transmits a reception failure message 161 to the transmitting end to request retransmission of the correct packet [100,011]. Meanwhile, the remainder generating unit 12a transmits the first packet 101p [100,111] to the pattern generating module 14 to be stored therein.

After the transmitting end retransmits the aforesaid correct packet [100,011], the reception module 11 receives a second packet 102p (a bit string of which is [100,001]), which comprises a plurality of second data bits and the CRC information. Like the processing of the first packet 101p [100,111], the determination module 12 calculates and determines whether the second packet 102p [100,001] is an erroneous packet according to the CRC information. In particular, the second packet 102p [100,001] is transmitted to the remainder generating unit 12a where a calculation is made according to the generation polynomial [101] to obtain a second CRC remainder 102r (a bit string of which is [11]). Next, the remainder generating unit 12a transmits the second CRC remainder 102r [11] to the remainder determination unit 12b, which determines whether the second CRC remainder 102r [11] is equal to zero. Because the second CRC remainder 102r [11] is not equal to zero, the second packet 102p [100, 001] is also determined to be an erroneous packet. Then, the transmission module 15 transmits another reception failure message 162 to the transmitting end to request retransmission of the correct packet [100,011]. Meanwhile, the remainder generating unit 12a transmits the second packet 102p [100, 001] to the pattern generating module 14 to be stored therein.

According to the first packet 101p [100,111] and the second packet 102p [100,001] previously stored, the pattern generating module 14 retrieves each of the first data bits of the first packet 101p [100,111] and each of the second data bits of the second packet 102p [100,001] to perform an XOR logical operation thereon to obtain a first error pattern 131 (a bit string of which is [000,110]). In the first error pattern 131 [000,110], bits with a value of [1] represent bits where the first packet 101p [100,111] is different from the second packet 102p [100,001]. In other words, in the first error pattern 131 [000,110], bits with a value of [1] represent bits where an error arises in the first packet 101p [100,111] and the second packet 102p [100,001].

As the transmission module 15 transmits the reception failure message 162 to the transmitting end to request retransmission of the correct packet [100,011], the transmitting end retransmits the correct packet after receiving the reception failure message 162. Afterwards, the reception module 11 receives a third packet 103p (a bit string of which is [100, 100]), which comprises a plurality of third data bits and the CRC information. Similar to what was described in connection with the first packet 101p [100, 111] and the second packet 102p [100,001], the determination module 12 determines whether the third packet 103p [100,100] is an erroneous packet according to the CRC information. In particular, the third packet 103p [100,100] is transmitted to the remainder generating unit 12a where calculation is made according to the generation polynomial [101] to obtain a third CRC remainder 103r (a bit string of which is [01]). Next, the remainder generating unit 12a transmits the third CRC remainder 103r [01] to the remainder determination unit 12b, which determines whether the third CRC remainder 103r [01] is equal to zero. Because the third CRC remainder 103r [01] is still not equal to zero, the third packet 103p [100,100] is also determined to be an erroneous packet. Meanwhile, the remainder generating unit 12a transmits the third packet 103p [100,100] to the pattern generating module 14 to be stored therein.

It should be particularly noted herein that the present invention is not limited to use of the CRC error detection approach to determine whether the first packet 101p, the second packet 102p or the third packet 103p is an erroneous packet. Rather, depending on the practical needs, those of ordinary skill in the art may choose other error detection approaches to determine whether the first packet 101p, the second packet 102p or the third packet 103p is an erroneous packet and, therefore, this will not be further described herein.

From the first packet 101p [100,111], the second packet 102p [100,001] and the third packet 103p [100,100] previously stored, the pattern generating module 14 retrieves each data bit of two of the packets to perform a further XOR logical operation thereon to obtain a second error pattern. In this embodiment, the pattern generating module 14 retrieves each of the first data bits of the first packet 101p [100,111] and each of the third data bits of the third packet 103p [100,100] to perform an XOR logical operation thereon to obtain a second error pattern 132 (a bit string of which is [000,011]). Likewise, in the second error pattern 132 [000,011], bits with a value of [1] represent bits where the first packet 101p [100, 111] is different from the third packet 103p [100,100]. In other words, in the second error pattern 132 [000,011], bits with a value of [1] represent bits where an error arises in the first packet 101p [100,111] and the third packet 103p [100, 100].

Thereafter, by performing an OR logical operation on the first error pattern 131 [000,110] and the second error pattern 132 [000,011], the pattern generating module 14 calculates all erroneous bits in the first packet 101p [100,111], the second packet 102p [100,001] and the third packet 103p [100, 100] to generate a third error pattern 133 (a bit string of which is [000,111]).

Afterwards, the packet generating unit 13a generates a plurality of target packets according to the third error pattern 133 [000,111] and either the first packet 101p [100,111], the second packet 102p [100,001] or the third packet 103p [100, 100]. In this embodiment, the packet generating unit 13a generates eight target packets according to the first packet 101p [100,111] and the third error pattern 133 [000,111], namely, 151p [100,000], 152p [100,001], 153p [100,010], 154p [100,011], 155p [100,100], 156p [100,101], 157p [100, 110] and 158p [100,111].

The remainder generating unit 12a receives these target packets 151p, 152p, . . . , 158p and, according to the generation polynomial [101], calculates target CRC remainders 151r [10], 152r [11], 153r [100], 154r [0], 155r [01], 156r [10], 157r [11] and 158r [100] corresponding to the target packets 151p, 152p, . . . , 158p respectively. Then, the remainder determination unit 12b receives the target CRC remainders 151r, 152r, . . . , 158r and sequentially determines whether each of them is equal to zero.

Because the target CRC remainder 154r [0] is equal to zero, the remainder determination unit 12b determines that the target packet 154p [100,011] corresponding to the target CRC remainder 154r [0] is the correct packet, thus completing the data correction method of the present invention.

If none of the aforesaid target CRC remainders is equal to zero, the transmission module 15 retransmits another reception failure message to the transmitting end to request retransmission of the correct packet [100,011], and operations described above are repeated again. In more detail, if the receiving end receives S erroneous packets in total, the pattern generating module 14 only needs to retrieve (S-1) pairs of erroneous packets and performs an XOR logical operation on the data bits of each pair of erroneous packets to obtain (S-1) error patterns. Then, an OR logical operation is performed on the error patterns to generate an error pattern for calculating the target packets.

For example, when the receiving end receives five erroneous packets E1, E2, E3, E4 and E5, the error pattern can be calculated through (E1 XOR E2) OR (E2 XOR E3) OR (E3 XOR E4) OR (E4 XOR E5), or through (E1 XOR E2) OR (E1 XOR E3) OR (E1 XOR E4) OR (E1 XOR E5). The packet generating unit 13a then calculates each of the target packets, according to the error pattern for calculating the target packets, via one or more of the five erroneous packets E1, E2, E3, E4 and E5. Based on the above description, those of ordinary skill in the art may calculate the error patterns and the target packets according to a different number of erroneous packets and calculate the correct packet through an exhaustive algorithm according to the target packets, and therefore, this will not be further described herein.

Figure 2:
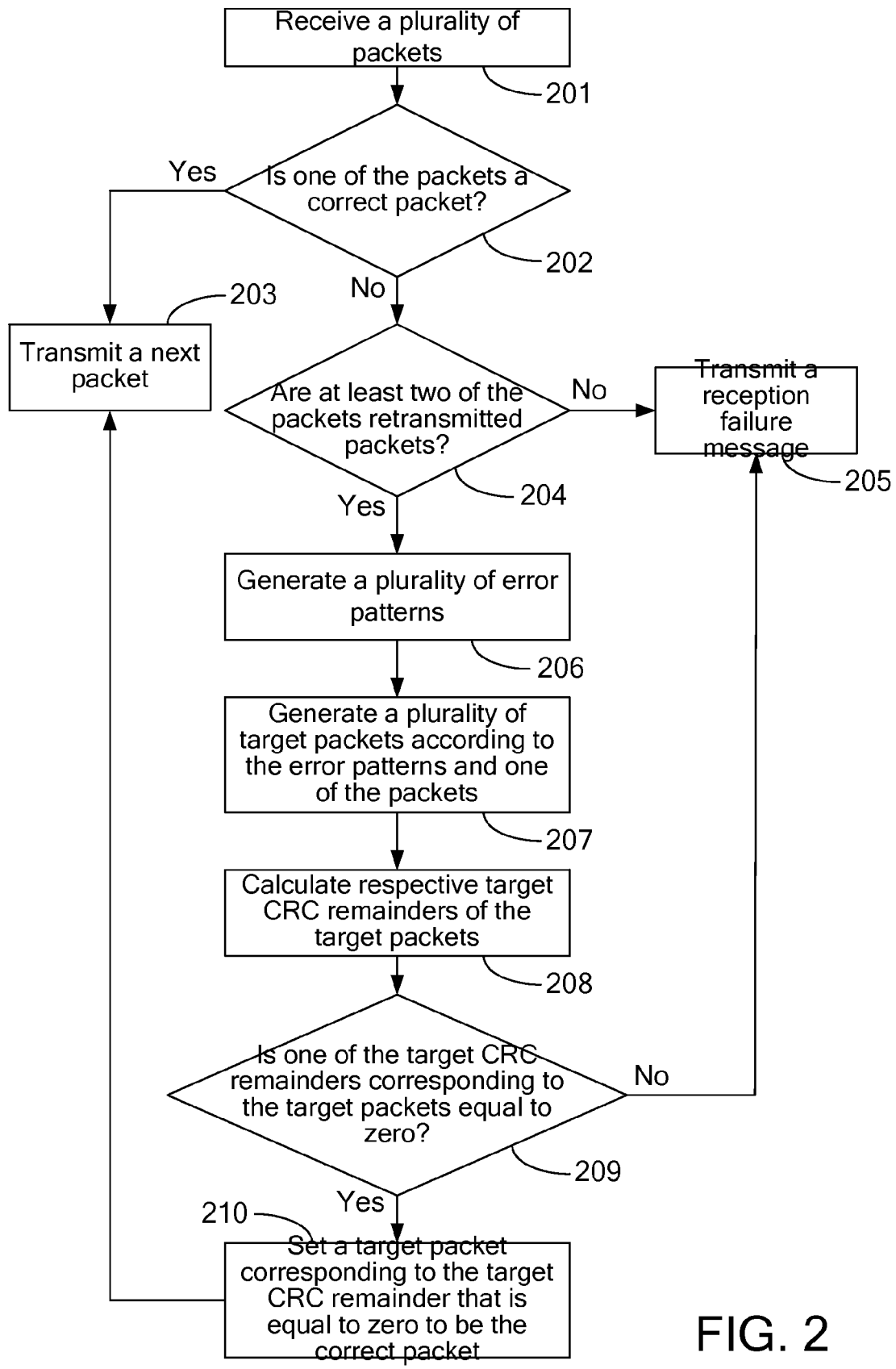
FIG. 2 is a flowchart of a second embodiment of the present invention.

FIG. 2 depicts a second embodiment of the present invention, which is a data correction method. This data correction method is adapted for a data correction apparatus, e.g., the data correction apparatus 1 described in the first embodiment. The data correction apparatus 1 may be deployed at a receiving end of a wired or wireless communication system (not shown) with an ARQ/HARQ or spatial multiplexing scheme. More specifically, the data correction method of the second embodiment may be implemented by a tangible machine-readable medium. When the tangible machine-readable medium is loaded into the data correction apparatus 1 via a computer and a plurality of codes incorporated in the computer program product are executed, the data correction method of the second embodiment can be accomplished. This computer program product may be stored in a tangible machine-readable medium, such as a read only memory (ROM), a flash memory, a floppy disk, a hard disk, a compact disk, a mobile disk, a magnetic tape, a database accessible to networks, or any other storage media with the same function and well known to those skilled in the art.

The second embodiment comprises the following steps. Initially, step 201 is executed to receive a plurality of packets, for example, the first packet, the second packet and the third packet described in the first embodiment. The first packet comprises a plurality of first data bits and a CRC information; the second packet comprises a plurality of second data bits and the CRC information; and the third packet comprises a plurality of third data bits and the CRC information. Then, step 202 is executed to determine whether one of the packets is a correct packet according to the CRC information. More particularly, by using the first packet, the second packet and the third packet as a dividend respectively and a generation polynomial as a divisor, a binary division operation is performed to obtain a first CRC remainder, a second CRC remainder and a third CRC remainder respectively. If the first CRC remainder, the second CRC remainder or the third CRC remainder is equal to zero, this means that one of the packets is the correct packet. Then, step 203 is executed to transmit another packet.

On the other hand, if none of the CRC remainders (i.e., the first CRC remainder, the second CRC remainder and the third CRC remainder) is equal to zero in step 202, this means that all these packets are erroneous. Then, step 204 is executed to determine whether at least two of the packets are retransmitted. If all the packets are independent packets unrelated to each other, step 205 is executed to transmit a reception failure message.

Because both the second packet and the third packet are retransmitted packets, step 206 is executed to generate a plurality of error patterns according to the packets, e.g., the first error pattern, the second error pattern and the third error pattern described in the first embodiment. Afterwards, step 207 is executed to generate a plurality of target packets according to the error patterns and one or more of the packets. Next, step 208 is executed to calculate a respective target CRC remainder of each of the target packets, and step 209 is executed to determine whether one of the target CRC remainders is equal to zero.

If it is determined in step 209 that one of the target CRC remainders is equal to zero, step 210 is then executed to set the target packet corresponding to the target CRC remainder to be a correct packet. Next, step 203 is executed to transmit another packet. Otherwise, if it is determined in step 208 that none of the target CRC remainders is equal to zero, this data correction method returns to step 205 to transmit a reception failure message anew to request the retransmission of the packet by the transmitting end.

In addition to the aforesaid steps, the second embodiment can also execute the operations and functions set forth with respect to the data correction apparatus 1 of the first embodiment. The method in which the second embodiment executes these operations and functions will be readily appreciated by those of ordinary skill in the art based on the explanation of the first embodiment and, thus, will not be further described herein.

Figure 3:
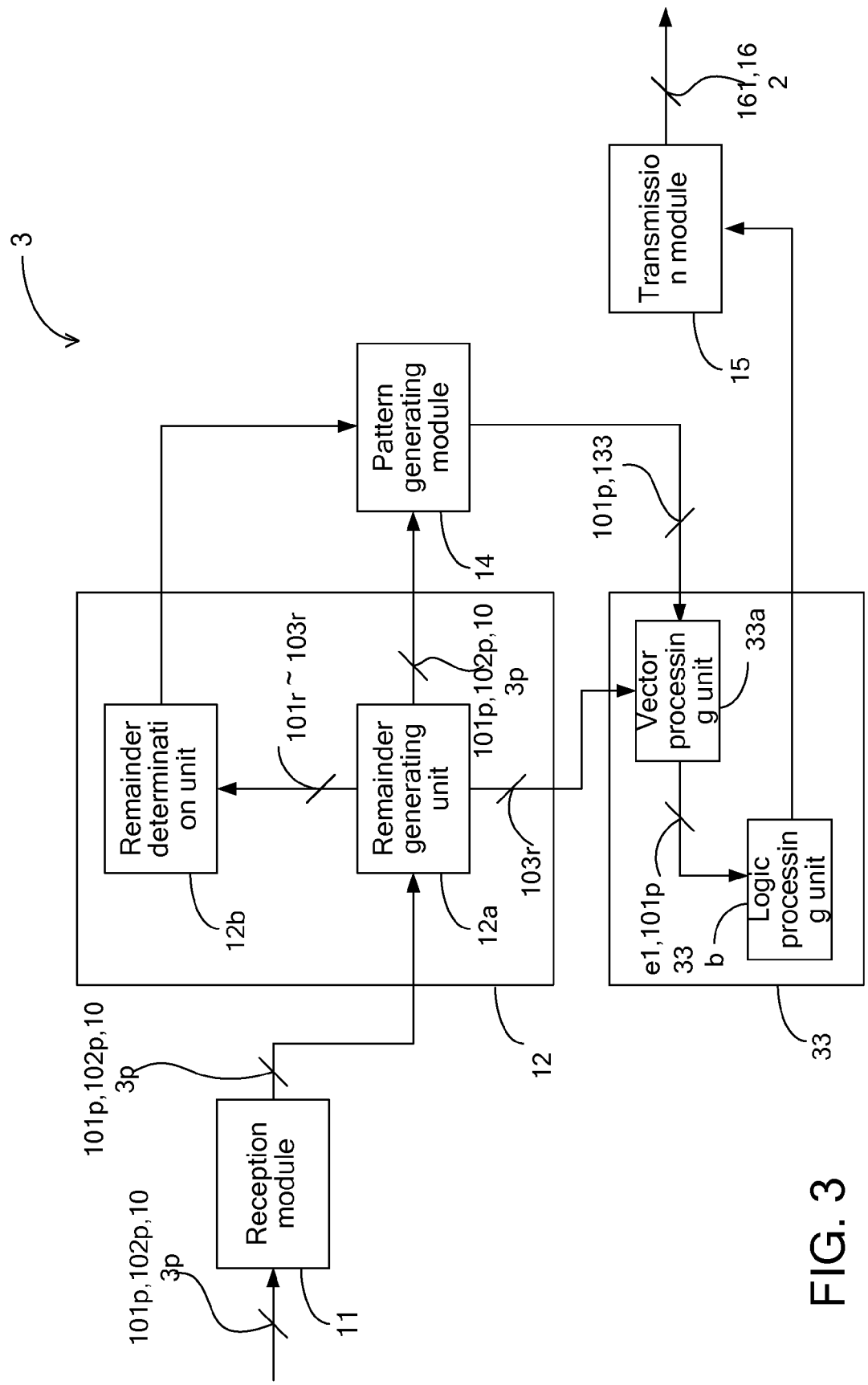
FIG. 3 is a schematic view of a third embodiment of the present invention.

FIG. 3 depicts a third embodiment of the present invention, which is a data correction apparatus 3. The data correction apparatus 3 comprises a reception module 11, a determination module 12, a calculation module 33, a pattern generating module 14 and a transmission module 15. The calculation module 33 comprises a vector processing unit 33a and a logical processing unit 33b, and the determination module 12 comprises a remainder generating unit 12a and a remainder determination unit 12b. This embodiment differs from the first embodiment in the way in which the correct packet is calculated. It should be appreciated that elements bearing the same reference numerals as those of FIG. 1 have already been described in the first embodiment, and thus will not be further described herein.

In reference to FIG. 3, as in the first embodiment, the reception module 11 receives the first packet 101p [100,111], the second packet 102p [100,001] and the third packet 103p [100,100] respectively, and the remainder generating unit 12a calculates a first CRC remainder 101r [100], a second CRC remainder 102r [11] and a third CRC remainder 103r [01] corresponding thereto respectively according to the generation polynomial [101]. Then, the remainder determination unit 12b determines that the first packet 101p, the second packet 102p and the third packet 103p are all erroneous packets. The transmission module 15 transmits reception failure messages 161, 162 to the transmitting end. The pattern generating module 14 calculates a third error pattern 133 [000, 111] according to the following operation: (the first packet 101p XOR the second packet 102p) OR (the first packet 101p XOR the third packet 103p).

An erroneous packet may be considered as a result of performing an operation on the correct packet and an error pattern vector, so the correct packet can be deduced if the error pattern vector is known. For example, the first packet 101p [100,111] may be represented as a result of performing an XOR logical operation on the correct packet [100,011] and the error pattern vector [000,100], so if the error pattern vector [000,100] is obtained, the correct packet can be derived according to the first packet 101p.

As can be seen from the first embodiment, the third error pattern 133 is calculated according to the first packet 101p, the second packet 102p and the third packet 103p. Therefore, the third error pattern 133 is linearly correlated to the error pattern vector corresponding to the first packet 101p, the second packet 102p or the third packet 103p. For example, assuming that the third error pattern 133 may be represented as a vector $e^* = b_1 + b_2 + \ldots b_m$ ($b_1, b_2, \ldots, b_m$ each represent a unit vector respectively), then the error pattern vector $e_1$ corresponding to the first packet 101p can be represented as a linear relational expression: $e_1 = c_1 b_1 + c_2 b_2 + \ldots + c_m b_m$ ($c_1, c_2, \ldots, c_m$ each represent a scalar). Accordingly, this embodiment calculates the error pattern vector according to the following formula:

where m represents $$[h_{11} \; h_{12} \; \ldots \; h_{1m}] \begin{bmatrix} c_1 \\ c_2 \\ \vdots \\ c_m \end{bmatrix} = r$$

[1] in an error pattern vector (e.g., the third error pattern 133), r represents a vector of the CRC remainders of the erroneous packets (e.g., the first CRC remainder 101r, the second CRC remainder 102r or the third CRC remainder 103r), $(c_1 c_2 \ldots c_m)^T$ represents a vector of scalars associated with the error pattern vectors, and $h_{11}, h_{12}, \ldots, h_{1m}$ represent a vector of remainders associated with the error patterns (e.g., the third error pattern 133) and the generation polynomial respectively.

From the perspective of linear algebra, the third error pattern 133 [000,111] can be represented as a polynomial of $X^2+X+1$ which, in turn, can be represented by an inner product of a vector $(X^5 X^4 X^3 X^2 X 1)$ and a vector $(000111)^T$. Hereinbelow, a vector $(000111)^T$ is used to represent the vector e* of the third error pattern 133. Similarly, a vector $(101)^T$ is used to represent the vector of the generation polynomial [101], a vector $(100)^T$ is used to represent the first CRC remainder 101r [100], a vector $(011)^T$ is used to represent the second CRC remainder 102r [11], and a vector $(001)^T$ is used to represent the third CRC remainder 103r [01]. It should be understood that what is described above may all be readily understood by those of ordinary skill in the art and thus will not be further described herein.

The vector processing unit $33a$ has the vector e* of the third error pattern 133 represented as at least one vector. In other words, $(000111)^T=(000001)^T+(000010)^T+(000100)^T$, where $b_1=(000001)^T$, $b_2=(000010)^T$ and $b_3=(000100)^T$ are all unit vectors. Also, for example, the error pattern vector $e_1$ corresponding to the first packet 1001p can be represented as $c_1b_1+c_2b_2+c_3b_3$. Next, by using the unit vectors $b_1$, $b_2$, $b_3$ as a dividend respectively and the generation polynomial vector $(101)^T$ as a divisor, the vector processing unit $33a$ derives the remainder vectors $h_{11}$, $h_{12}$, ..., $h_{1m}$ thereof respectively. It should be emphasized that, $[h_{11} h_{12} ... h_{1m}]$ is not necessarily a square matrix. For example, if CRC-32 (i.e., the CRC remainder it corresponds to has 32 bits) is used as the generation polynomial and the third error pattern 133 has three bits [1], then $[h_{11}, h_{12}h_{13}]$ is a 32×3 matrix.

This embodiment will use the first packet 101p and the error pattern vector e1 thereof to calculate the correct packet; however, upon reviewing the description of this embodiment, those of ordinary skill in the art may also use the second packet 102p and the error pattern vector thereof, or the third packet 103p and the error pattern vector thereof to calculate the correct packet. In this embodiment, m=3, and the remainder vectors derived by the vector processing unit 33a are $h_{11}=(001)^T$, $h_{12}=(010)^T$ and $h_{13}=(100)^T$ respectively. Meanwhile, $r=(100)^T$ (the vector of the first CRC remainder 101r [100]). Thus, by substituting the values of this embodiment, the aforesaid formula is simplified as:

$$\begin{bmatrix} 0 & 0 & 1 \\ 0 & 1 & 0 \\ 1 & 0 & 0 \end{bmatrix} \begin{bmatrix} c_1 \\ c_2 \\ c_3 \end{bmatrix} = \begin{bmatrix} 1 \\ 0 \\ 0 \end{bmatrix}$$

There are a number of approaches to calculate $(c_1c_2c_3)^T$ in the prior art, such as the pseudo inverse approach, the Gaussian elimination approach and etc. In this embodiment, at least one error pattern is generated according to the remainder vectors $h_{11}$, $h_{12}$, $h_{13}$ and the vector r of the first CRC remainder 101r, and an intersection operation is performed on the error patterns to obtain an error pattern vector $e_1$.

In particular, three equations can be derived from the above formula through observation, namely, $c_3=1$, $c_2=0$ and $c_1=0$ respectively. For $c_3=1$, the vector processing unit $33a$ generates an error pattern $S1=\{(c_1c_2c_3)^T=(001)^T, (011)^T, (101)^T, (111)^T\}$. Next, for $c_2=0$, the vector processing unit $33a$ generates an error pattern $S2=\{(c_1c_2c_3)^T=(001)^T, (101)^T, (100)^T, (000)^T\}$, and for $c_1=0$, the vector processing unit $33a$ generates an error pattern $S3=\{(c_1c_2c_3)^T=(001)^T, (011)^T, (010)^T, (000)^T\}$. Afterwards, the vector processing unit $33a$ performs an intersection operation on the error patterns S1, S2, S3 to obtain $(c_1c_2c_3)^T=(001)$, which means that the error pattern vector corresponding to the first packet 101p is $e_1=c_1(000001)^T+c_2(000010)^T+c_3(000100)^T=(000100)^T$. The vector processing unit $33a$ then transmits the error pattern vector $e_1$ to the logical processing unit $33b$. Then, the logical processing unit $33b$ performs an XOR logical operation on the error pattern vector $(000100)^T$ and the vector of the first packet 101p to obtain a vector $(100011)^T$ of the correct packet. In other words, the correct packet is [100,011]. If, subsequent to the intersection operation, the vector processing unit $33a$ still fails to solve the $(c_1c_2c_3)^T$, the transmission module 15 will a new retransmission request.

In a preferred example, this embodiment may further use a deletion approach. In particular, the vector processing unit $33a$ initially calculates the error pattern $S1=\{(c_1c_2c_3)^T=(001)^T, (011)^T, (101)^T, (111)^T\}$. Next, the vector processing unit $33a$ substitutes the error pattern S1 into the second equation $c_2=0$ to delete impossible solutions thereof, thereby yielding the error pattern $S2=\{(c_1c_2c_3)^T=(001)^T, (101)^T\}$. Finally, the vector processing $33a$ substitutes the error pattern S2 into the equation $c_1=0$ to delete impossible solutions thereof, thereby yielding the error pattern $S3=\{(c_1c_2c_3)^T=(001)^T\}$.

When there are too many possibilities for $(c_1c_2c_3)^T$, the deletion approach can delete impossible combinations rapidly. In other words, for an error pattern with many bits of [1], the deletion approach only needs to generate a single set of error patterns and then substitute the error patterns thereof into other equations to delete erroneous combinations therefrom. This saves more calculation time as compared to other solutions. Because the number of rows that the deletion approach observes increases, the number of erroneous bit combinations that can be deleted increases exponentially, so it is possible to shorten the time of finding out the correct packet by using the deletion approach in combination with an appropriate data structure (e.g., a tree structure).

Figure 4:
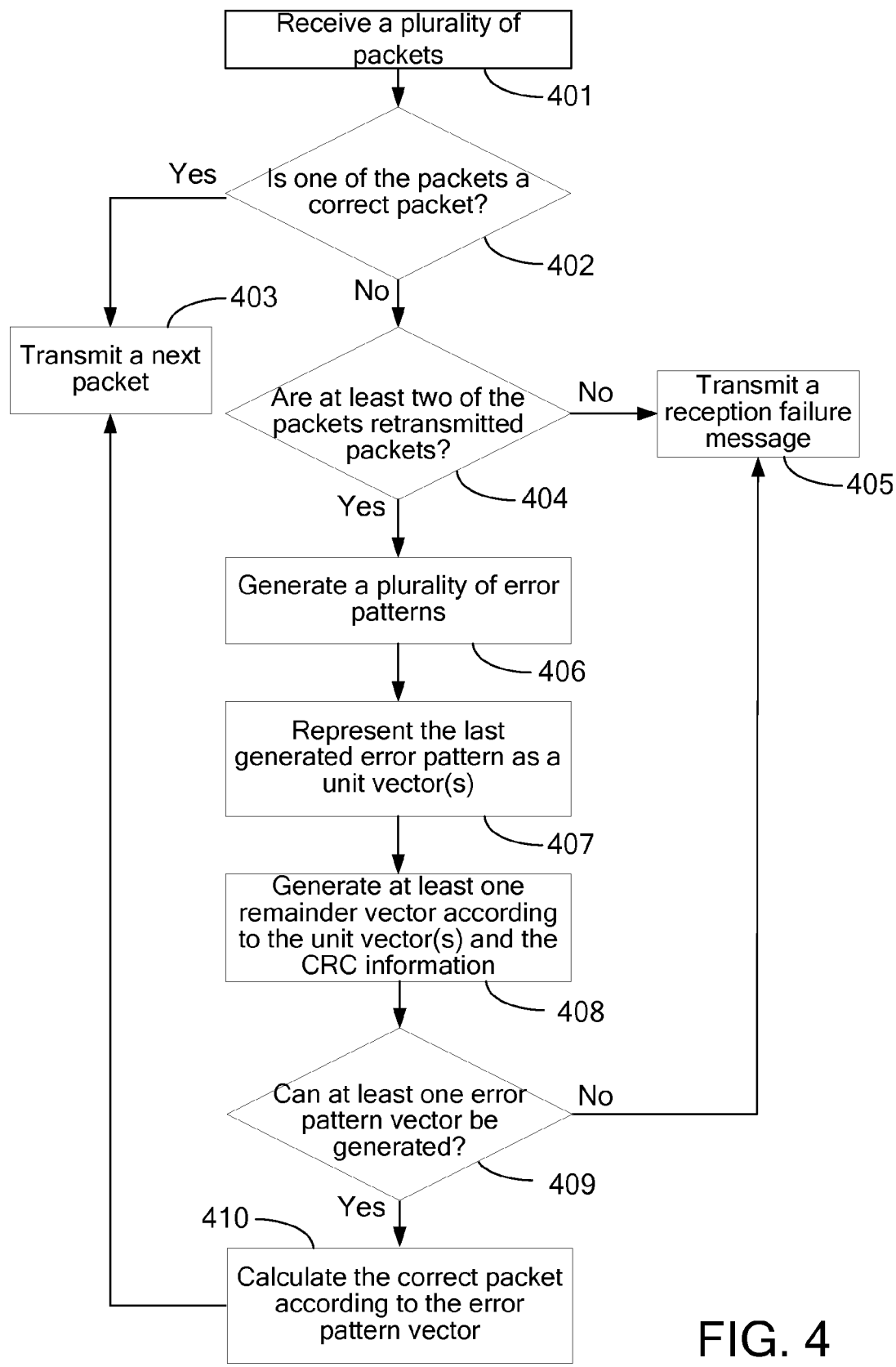
FIG. 4 is a flowchart of a fourth embodiment of the present invention.

FIG. 4 is a fourth embodiment of the present invention, which is a data correction method. This data correction method is adapted for a data correction apparatus, e.g., the data correction apparatus 3 described in the third embodiment. The data correction apparatus 3 may be deployed at a receiving end of a wired or wireless communication system (not shown) with an ARQ/HARQ or spatial multiplexing scheme. More specifically, the data correction method of the fourth embodiment may be implemented by a tangible machine-readable medium. When the tangible machine-readable medium is loaded into the data correction apparatus 3 via a computer and a plurality of codes incorporated in the computer program product are executed, the data correction method of the fourth embodiment can be accomplished. This computer program product may be stored in a tangible machine-readable medium, such as a read only memory (ROM), a flash memory, a floppy disk, a hard disk, a compact disk, a mobile disk, a magnetic tape, a database accessible to networks, or any other storage media with the same function and well known to those skilled in the art.

The fourth embodiment comprises the following steps. Initially, step 401 is executed to receive a plurality of packets, for example, the first packet, the second packet and the third packet described in the third embodiment. The first packet comprises a plurality of first data bits and a CRC information; the second packet comprises a plurality of second data bits and the CRC information; and the third packet comprises a plurality of third data bits and the CRC information. Then, step 402 is executed to determine whether one of the packets is a correct packet according to the CRC information. More particularly, by using the first packet, the second packet and the third packet as a dividend respectively and a generation polynomial as a divisor, a binary division operation is performed to obtain a first CRC remainder, a second CRC remainder and a third CRC remainder respectively. If either the first CRC remainder, the second CRC remainder or the third CRC remainder is equal to zero, this means that one of the packets is the correct packet. Then, step 403 is executed to transmit another packet.

On the other hand, if none of the CRC remainders (i.e., the first CRC remainder, the second CRC remainder and the third CRC remainder) is equal to zero in step 402, this means that all these packets are erroneous. Then, step 404 is executed to determine whether at least two of the packets are retransmitted ones. If all the packets are independent packets unrelated to each other, step 405 is executed to transmit a reception failure message.

Because both the second packet and the third packet are retransmitted packets in the third embodiment, step 406 is executed to generate a plurality of error patterns according to the packets, e.g., the third error pattern as described in the third embodiment. Afterwards, step 407 is executed to represent the last generated error pattern (e.g., the third error pattern) as at least one unit vector, e.g., the three unit vectors $b_1$, $b_2$, $b_3$ described in the third embodiment. Next, step 408 is executed to calculate at least one remainder vector (e.g., the remainder vector $h_{11}$, $h_{12}$, $h_{13}$ as described in the third embodiment) by using the unit vectors obtained in step 407 as a dividend respectively and a generation polynomial as a divisor. Thereafter, step 409 is executed to determine whether at least one error pattern vector can be obtained according to the remainder vector and one or more of the first CRC remainder, the second CRC remainder and the third CRC remainder.

More specifically, by substituting the remainder vector and one or more of the first CRC remainder, the second CRC remainder and the third CRC remainder into the formula described in the third embodiment, the error pattern vectors $c_1$, $c_2$, $c_3$ are calculated, the detailed calculation process of which has been described in the third embodiment. If step 409 fails to obtain an error pattern vector, step 405 is executed to transmit a reception failure message. Otherwise, if at least one error pattern vector is generated in step 409, then according to the error pattern vector, step 410 is executed to perform an XOR logical operation on the error pattern vector and the first, the second or the third packet to obtain the correct packet. Afterwards, this data correction method returns to step 403 to transmit another packet.

In addition to the aforesaid steps, the fourth embodiment can also execute the operations and functions set forth with respect to the data correction apparatus 3 of the third embodiment. The methods in which the fourth embodiment executes these operations and functions will be readily appreciated by those of ordinary skill in the art based on the explanation of the third embodiment and, thus, will not be further described herein.

According to the above description, the data correction apparatus, the data correction method and the tangible machine-readable medium thereof of the present invention perform a varied number of XOR logical operations and OR logical operations according to the information of data bits of erroneous packets to generate an error pattern. Then, data correction is performed according to the error pattern and the original packet. In this way, the present invention is able to reduce retransmissions of packets to increase the utilization factor of the network bandwidth resources while also decreasing the error rate of data transmissions.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A data correction method, the method comprising:
  receiving, by a processor, a first packet, wherein the first packet comprises a plurality of first data bits and cyclic redundancy check (CRC) information;
  determining that the first packet is an erroneous packet according to the CRC information;
  receiving, by the processor, a second packet, wherein the second packet comprises a plurality of second data bits and the CRC information;
  determining that the second packet is an erroneous packet according to the CRC information;
  receiving, by the processor, a third packet, wherein the third packet comprises a plurality of third data bits and the CRC information;
  determining that the third packet is an erroneous packet according to the CRC information;
  retrieving each of the first data bits and each of the second data bits to perform an exclusive-OR (XOR) logical operation thereon to generate a first error pattern;
  retrieving two of each of the first data bits, each of the second data bits and each of the third data bits to perform the XOR logical operation thereon to generate a second error pattern;
  performing an OR logical operation on the first error pattern and the second error pattern to generate a third error pattern; and
  calculating a correct packet according to the third error pattern and one or more of the first packet, the second packet and the third packet.

2. The data correction method of claim 1, wherein said determining that the first packet is an erroneous packet further comprises:
  generating a first CRC remainder according to the CRC information and the first packet; and
  determining whether the first CRC remainder is equal to zero;
  wherein the first packet is the erroneous packet when the first CRC remainder is not equal to zero.

3. The data correction method of claim 2, wherein said determining that the second packet is an erroneous packet further comprises:
  generating a second CRC remainder according to the CRC information and the second packet; and
  determining whether the second CRC remainder is equal to zero;
  wherein the second packet is the erroneous packet when the second CRC remainder is not equal to zero.

4. The data correction method of claim 3, wherein said determining that the third packet is an erroneous packet further comprises:
  generating a third CRC remainder according to the CRC information and the third packet; and
  determining whether the third CRC remainder is equal to zero;
  wherein the third packet is the erroneous packet when the third CRC remainder is not equal to zero.

5. The data correction method of claim 4, wherein said calculating the correct packet further comprises:
  converting the third error pattern into at least one unit vector;
  generating at least one remainder vector according to the at least one unit vector and the CRC information; and
  generating at least one error pattern vector according to the at least one remainder vector and one or more of the first CRC remainder, the second CRC remainder and the third CRC remainder;
  wherein the correct packet is obtained by performing the XOR logical operation on the at least one error pattern vector and one or more of the first packet, the second packet and the third packet.

6. The data correction method of claim 5, wherein the at least one unit vector comprises a plurality of unit vectors, the at least one remainder vector comprises a plurality of remainder vectors, and said generating the at least one error pattern vector further comprises:
generating a plurality of error patterns according to one or more of the first CRC remainder, the second CRC remainder and the third CRC remainder and each of the remainder vectors respectively;
wherein the at least one error pattern vector is obtained by performing an intersection operation on each of the error patterns.

7. The data correction method of claim 2, wherein said calculating the correct packet further comprises:
generating a plurality of target packets according to the third error pattern and one or more of the first packet, the second packet and the third packet;
generating a plurality of target CRC remainders corresponding to each of the target packets according to the CRC information and the target packets; and
determining whether each of the target CRC remainders is equal to zero;
wherein when one of the target CRC remainders is equal to zero, the target packet corresponding thereto is the correct packet.

8. The data correction method of claim 7, wherein said calculating the correct packet further comprises:
transmitting a reception failure message when none of the target CRC remainders is equal to zero.

9. A data correction apparatus, the data correction apparatus comprising:
a processor and a memory coupled to the processor for executing:
a reception module being configured to receive a first packet, a second packet, and a third packet, wherein the first packet comprises a plurality of first data bits and CRC information, the second packet comprises a plurality of second data bits and the CRC information, and the third packet comprises a plurality of third data bits and the CRC information;
a determination module being configured to determine that the first packet, the second packet, and the third packet are all erroneous packets according to the CRC information;
a pattern generating module being configured to retrieve each of the first data bits and each of the second data bits to perform an XOR logical operation thereon to generate a first error pattern, retrieve two of each of the first data bits, each of the second data bits and each of the third data bits to perform the XOR logical operation thereon to generate a second error pattern, and perform an OR logical operation on the first error pattern and the second error pattern to generate a third error pattern; and
a calculation module being configured to calculate a correct packet according to the third error pattern and one or more of the first packet, the second packet and the third packet.

10. The data correction apparatus of claim 9, wherein the determination module further comprises:
a remainder generating unit being configured to generate a first CRC remainder according to the CRC information and the first packet; and
a remainder determination unit being configured to determine whether the first CRC remainder is equal to zero; wherein the first packet is the erroneous packet when the first CRC remainder is not equal to zero.

11. The data correction apparatus of claim 10, wherein the remainder generating unit is configured to generate a second CRC remainder according to the CRC information and the second packet, the remainder determination unit is configured to determine whether the second CRC remainder is equal to zero, and the second packet is the erroneous packet when the second CRC remainder is not equal to zero.

12. The data correction apparatus of claim 11, wherein the remainder generating unit is configured to generate a third CRC remainder according to the CRC information and the third packet, the remainder determination unit is configured to determine whether the third CRC remainder is equal to zero, and the third packet is the erroneous packet when the third CRC remainder is not equal to zero.

13. The data correction apparatus of claim 12, wherein the calculation module is further configured to convert the third error pattern into at least one unit vector, generate at least one remainder vector according to the at least one unit vector and the CRC information, generate at least one error pattern vector according to the at least one remainder vector and one or more of the first CRC remainder, the second CRC remainder and the third CRC remainder, and perform the XOR logical operation on the at least one error pattern and one or more of the first packet, the second packet and the third packet to generate the correct packet.

14. The data correction apparatus of claim 13, wherein the at least one unit vector comprises a plurality of unit vectors, the at least one remainder vector comprises a plurality of remainder vectors, and the calculation module is configured to generate a plurality of error patterns according to one or more of the first CRC remainder, the second CRC remainder and the third CRC remainder as well as each of the remainder vectors respectively, and perform an intersection operation on each of the error patterns to generate the at least one error pattern vector.

15. The data correction apparatus of claim 10, wherein the calculation module further comprises:
a packet generating unit being configured to generate a plurality of target packets according to the third error pattern and one or more of the first packet, the second packet and the third packet;
wherein the remainder generating unit of the determination module is configured to generate a plurality of target CRC remainders corresponding to each of the target packets according to the CRC information and the target packets, and the remainder determination unit of the determination module is configured to determine whether each of the target CRC remainders is equal to zero;
wherein when one of the target CRC remainders is equal to zero, the target packet corresponding thereto is the correct packet.

16. The data correction apparatus of claim 15, further comprising:
a transmission module being configured to transmits a reception failure message when none of the target CRC remainders is equal to zero.

17. A non-transitory machine-readable storage medium storing a program of a data correction method for a data correction apparatus, the program comprising:
a code A for a reception module to receive a first packet, wherein the first packet comprises a plurality of first data bits and CRC information;
a code B for a determination module to determine that the first packet is an erroneous packet according to the CRC information;
a code C for the reception module to receive a second packet, wherein the second packet comprises a plurality of second data bits and the CRC information;

a code D for the determination module to determine that the second packet is an erroneous packet according to the CRC information;

a code E for the reception module to receive a third packet, wherein the third packet comprises a plurality of third data bits and the CRC information;

a code F for the determination module to determine that the third packet is an erroneous packet according to the CRC information;

a code G for a pattern generating module to retrieve each of the first data bits and each of the second data bits to perform an XOR logical operation thereon to generate a first error pattern;

a code H for the pattern generating module to retrieve two of each of the first data bits, each of the second data bits and each of the third data bits to perform the XOR logical operation thereon to generate a second error pattern;

a code I for the pattern generating module to perform an OR logical operation on the first error pattern and the second error pattern to generate a third error pattern; and a code J for a calculation module to calculate a correct packet according to the third error pattern and one or more of the first packet, the second packet, and the third packet.

18. The non-transitory machine-readable storage medium of claim 17, wherein the code B further comprises:

a code B1 for a remainder generating unit to generate a first CRC remainder according to the CRC information and the first packet; and a code B2 for a remainder determination unit to determine whether the first CRC remainder is equal to zero;

wherein the first packet is the erroneous packet when the first CRC remainder is not equal to zero.

19. The non-transitory machine-readable storage medium of claim 18, wherein the code D further comprises:

a code D1 for the remainder generating unit to generate a second CRC remainder according to the CRC information and the second packet; and a code D2 for the remainder determination unit to determine whether the second CRC remainder is equal to zero;

wherein the second packet is the erroneous packet when the second CRC remainder is not equal to zero.

20. The non-transitory machine-readable storage medium of claim 19, wherein the code F further comprises:

a code F1 for the remainder generating unit to generate a third CRC remainder according to the CRC information and the third packet; and a code F2 for the remainder determination unit to determine whether the third CRC remainder is equal to zero;

wherein the third packet is the erroneous packet when the third CRC remainder is not equal to zero.

21. The non-transitory machine-readable storage medium of claim 20, wherein the code J further comprises:

a code J1 for the calculation module to convert the third error pattern into at least one unit vector;

a code J2 for the calculation module to generate at least one remainder vector according to the at least one unit vector and the CRC information; and a code J3 for the calculation module to generate at least one error pattern vector according to the at least one remainder vector and one or more of the first CRC remainder, the second CRC remainder and the third CRC remainder;

wherein the correct packet is obtained by performing the XOR logical operation on the at least one error pattern vector and one or more of the first packet, the second packet and the third packet.

22. The tangible non-transitory machine-readable storage medium of claim 21, wherein the at least one unit vector comprises a plurality of unit vectors, the at least one remainder vector comprises a plurality of remainder vectors, and the code J3 further comprises:

a code J4 for the calculation module to generate a plurality of error patterns according to one or more of the first CRC remainder, the second CRC remainder and the third CRC remainder and each of the remainder vectors respectively;

wherein the at least one error pattern vector is obtained by performing an intersection operation on each of the error patterns.

23. The non-transitory machine-readable storage medium of claim 18, wherein the code J further comprises:

a code J1 for a packet generating unit to generate a plurality of target packets according to the third error pattern and one or more of the first packet, the second packet and the third packet;

a code J2 for the remainder generating unit to generate a plurality of target CRC remainders corresponding to each of the target packets according to the CRC information and the target packets; and a code J3 for the remainder determination unit to determine whether each of the target CRC remainders is equal to zero;

wherein when one of the target CRC remainders is equal to zero, the target packet corresponding thereto is the correct packet.

24. The non-transitory machine-readable storage medium of claim 23, wherein the code J further comprises:

a code J4 for a transmission module to transmit a reception failure message when none of the target CRC remainders is equal to zero.

* * * * *